United States Patent
Chang

Patent Number: 5,687,118
Date of Patent: Nov. 11, 1997

[54] PMOS MEMORY CELL WITH HOT ELECTRON INJECTION PROGRAMMING AND TUNNELLING ERASING

[75] Inventor: Shang-De Ted Chang, Fremont, Calif.

[73] Assignee: Programmable Microelectronics Corporation, San Jose, Calif.

[21] Appl. No.: 557,589

[22] Filed: Nov. 14, 1995

[51] Int. Cl.$^6$ ........................................... G11C 11/34
[52] U.S. Cl. ........................ 365/185.19; 365/185.1; 365/185.27; 257/315
[58] Field of Search ................. 365/185.27, 185.1, 365/185.19; 257/315, 185.28, 185.01, 314, 316, 317

[56] References Cited

U.S. PATENT DOCUMENTS

| | | | |
|---|---|---|---|
| 4,435,790 | 3/1984 | Tickle et al. | 365/218 |
| 4,637,128 | 1/1987 | Mizutani | 257/316 |
| 5,262,985 | 11/1993 | Wada | 365/185.27 |
| 5,416,738 | 5/1995 | Shrivastava | 365/185.27 |
| 5,514,889 | 5/1996 | Cho et al. | 257/316 |

FOREIGN PATENT DOCUMENTS

| | | |
|---|---|---|
| 0079636 | 11/1982 | European Pat. Off. . |
| 0255489 | 6/1987 | European Pat. Off. . |
| 0618621 | 4/1994 | European Pat. Off. . |

OTHER PUBLICATIONS

IBM Corp., "*High Speed, Low-Power/Low-Voltage P-Channel NVRAM Using Channel-Hot-Carrier Programming and Tunneling Erase Through Silicon-Rich Oxide*", IBM Technical Disclosure Bull., vol. 35, 5:339–40 (Oct. 1992).

Yang, "Microelectronic Devices," McGraw–Hill Inc., pp. 85, 285, 346–347 1988.

Masonori Kikuchi, Shuichi Ohya and Machio Yamagishi, *A New Technique To Minimize The EPROM Cell*, IC Division, Nippon Electric Company, Ltd., 1753, Shimonumabe, Kawasaki, Japan, pp. 181–182.

Dov Frohman–Bentchkowsky, INTEL Corporation, Santa Clara, California, *FAMOS—A New Semiconductor Charge Storage Device*, Solid State Electronics 1974, vol. 17 pp. 517–529.

Constantine A. Neugebauer and James F. Burgess, General Electric Corporation, *Session XV: Programmable Read–Only Memories*, Feb. 18, 1977, pp. 184–185.

S. Baba, A. Kita and J. Ueda, *Mechanism of Hot Carrier Induced Degradation IN Mosfet's*, VLSI R&D Center, Oki Electric Industry Co., Ltd., 1986, pp. 734–737.

*Primary Examiner*—David C. Nelms
*Assistant Examiner*—F. Niranjan
*Attorney, Agent, or Firm*—Flehr Hohbach Test; Albritton & Herbert LLP; William L. Paradice III

[57] ABSTRACT

A P-channel MOS memory cell has P+ source and drain regions formed in an N-well. A thin tunnel oxide is provided between the well surface and an overlying floating gate. In one embodiment, the thin tunnel oxide extends over a substantial portion of the active region and the device. An overlying control gate is insulated from the floating gate by an insulating layer. The device is programmed via hot electron injection from the drain end of the channel region to the floating gate, without avalanche breakdown, which allows the cell to be bit-selectable during programming. Erasing is accomplished by electron tunneling from the floating gate to the N-well with the source, drain, and N-well regions equally biased. Since there is no high drain/well junction bias voltage, the channel length of the cell may be reduced without incurring and destructive junction stress.

18 Claims, 8 Drawing Sheets

PMOS MEMORY CELL WITH HOT ELECTRON INJECTION PROGRAMMING AND TUNNELLING ERASING

CROSS REFERENCE TO RELATED APPLICATIONS

This application is related to the U.S. patent application Ser. No. 08/557,514 entitled "A PMOS Flash Memory Cell Capable of Multi-level Threshold Voltage Storage", U.S. patent application Ser. No. 08/557,442 entitled "Non-volatile Electrically Erasable Memory with PMOS Transistor NAND Gate Structure", both filed on Nov. 14, 1995, and U.S. patent application Ser. No. 08/560,249 entitled "PMOS Flash EEPROM Cell with Single Poly", filed on Nov. 21, 1995.

BACKGROUND

1. Field of the Invention

This invention relates generally to non-volatile memory devices and specifically to very high density and high speed non-volatile memory devices.

2. Description of Related Art

Early semiconductor memories employed P-channel floating-gate avalanche-injection MOS (FAMOS) devices. These devices are programmed by applying a 35 volt reverse bias across the N-well/drain junction such that high energy electrons generated by avalanche breakdown are injected from the depletion layer to the floating gate. The floating gate is typically erased, i.e., discharged, using UV radiation. In addition to having relatively slow operating speeds, the large reverse bias required for avalanche programming undesirably necessitates the on-chip generation of high voltages and also limits the extent to which the device size may be minimized.

As NMOS technology improved, manufactures were able to take advantage of the faster intrinsic mobility of electrons, as compared with that of holes, and began fabricating N-channel memory devices such as EPROMs and EEPROMs which were faster and required lower programming voltages than FAMOS cells. A floating gate EPROM cell, such as the ETOX Flash EPROM cell manufactured by Intel Corporation of Santa Clara, Calif., is charged by the hot injection of electrons from the N-channel/N+ drain junction region without an avalanche breakdown of the junction. Such programming may be realized, for instance, by applying 12 volts to the control gate and 7 volts to the drain while grounding the source region. This electrical bias causes electrons to accelerate across the channel region toward the drain. The high energy electrons created near the N-channel/N+ drain junction by the resulting impact ionization are attracted by the more positive control gate voltage and are injected into the floating gate. Erasing is typically accomplished via electron tunneling by applying 12 volts to the source while grounding the control gate. Programming via hot carrier injection allows such an EPROM cell to be bit-programmable and therefore eliminates the need for a select transistor. However, charging the floating gate via hot electron injection from the N-channel/N+ drain region requires high programming currents and, therefore, results in high power consumption. Further, the ETOX Flash EPROM cell described above suffers from read disturb and may have long term reliability problems as a result of high N+ source/P− substrate junction voltages during erasing. Moreover, erasing by band to band tunneling at the N+ source/P− substrate junction results in a high erase current, thereby consuming an undesirable amount of power during erasing.

The floating gate of a typical EEPROM memory cell is charged by the tunneling of electrons through a thin oxide layer insulating the floating gate from the source, drain, and channel. For instance, such an EEPROM cell may be erased by applying 20 volts to the control gate while the source, drain, and substrate are grounded. The resultant electric field causes electrons to tunnel through the oxide layer from the source, drain, and channel to the floating gate. Programming, i.e., discharging the floating gate, may be accomplished by holding the control gate at ground while applying 20 volts to the drain, thereby reversing the electric field and pulling electrons from the floating gate to the drain.

The EEPROM cell suffers from several drawbacks. First, in order to facilitate electron tunneling, a tunnel window must be opened in a region of the gate oxide proximate to the drain. This tunnel opening not only increases the size of the storage cell but also increases fabrication complexity and cost. Second, each EEPROM cell requires its own select transistor in order to be bit addressable during programming and reading. Further, such EEPROM cells require relatively high programming and erasing voltages of approximately 20 volts. The application of such high programming and erasing voltages across P/N junctions within the EEPROM cell undesirably limits the amount by which the cell size may be reduced.

SUMMARY

A non-volatile semiconductor memory cell is disclosed herein which overcomes problems in the art discussed above. In accordance with the present invention, a P-channel MOS transistor has P+ source and P+ drain regions formed in an N-type well which is formed in a P− substrate. A thin tunnel oxide is provided between the N-well surface and an overlying floating gate. In one embodiment, the thin tunnel oxide extends over a substantial portion of the active region of the device. An overlying control gate is insulated from the floating gate by an insulating layer.

The P-channel device is programmed via hot electron injection from the drain end of the channel region to the floating gate. This programming mechanism allows the cell to be bit-programmable using a low programming current and a low programming voltage. Erasing is accomplished by electron tunneling from the floating gate to the N-well, to the source, and to the drain with the N-well, source, and drain equally biased. Since there are no high drain/well junction bias voltages utilized in either the programming or erasing modes, the channel length of the cell may be reduced without incurring junction breakdown and destructive junction stress. The absence of such high P/N junction voltages allows the size of such cells to be minimized.

The P-channel memory cells in accordance with the present invention may operate in deep depletion when programmed, thereby allowing for a higher read current and thus a faster operating speed. Further, since the memory cells disclosed herein conduct a read current only if programmed, and when erased have a higher voltage on the source, drain, and N-well than on the floating gate, problems of read disturb are eliminated.

DETAILED DESCRIPTION

Figure 1:
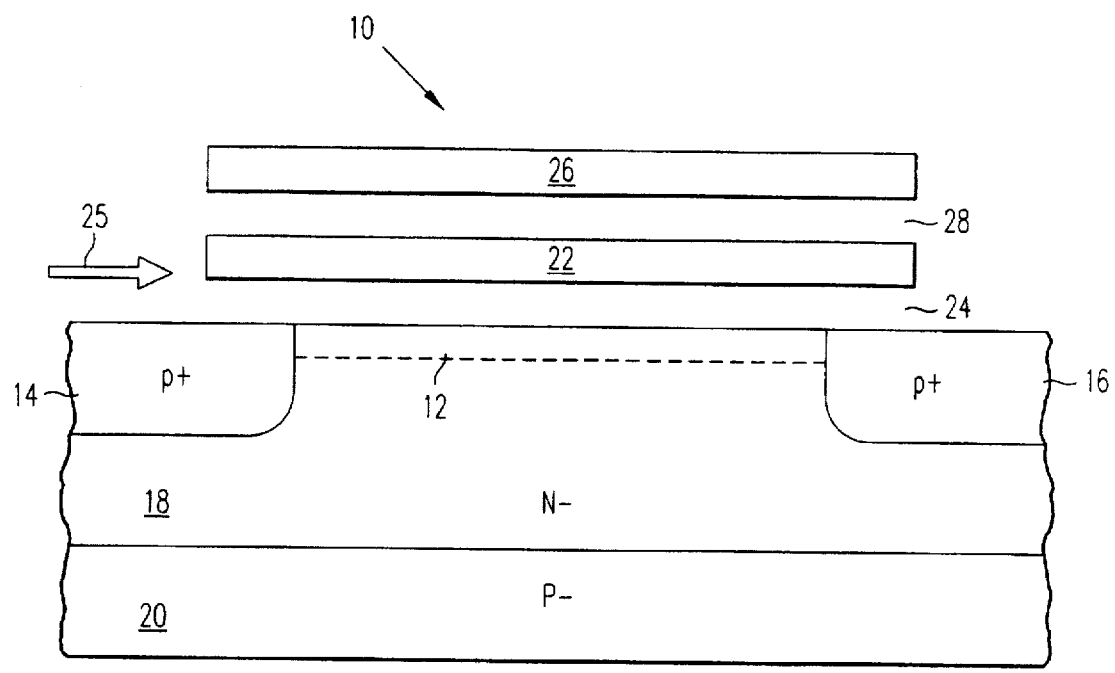
FIG. 1 is a cross-sectional view of a memory cell in accordance with the present invention.

Referring to FIG. 1, a flash memory cell 10 has a channel 12 extending between P+ source 14 and P+ drain 16 regions formed in an N– well 18 of a P– substrate 20. Note that although shown in FIG. 1 as being formed in N– well 18, cell 10 may in other embodiments may be formed in any other suitable underlying N– type structure. A floating gate 22 is insulated from the surface of N– well 18 by a thin tunneling oxide layer 24. In the preferred embodiment shown in FIG. 1, tunneling oxide layer 24 has a thickness of approximately 80–130 Å and extends over the entire length of channel 12 and portions of both P+ source 14 and P+ drain 16. It is to be understood, however, that in other embodiments tunneling oxide layer 24 may be of other varying lengths, length being in the direction indicated by arrow 25. For instance, in one embodiment (not shown), tunneling oxide layer 24 extends only over a portion of P+ drain 16, wherein the remaining surface of N– well 18 has a thick gate oxide layer formed thereon.

A control gate 26 is insulated from floating gate 22 by an insulating layer 28 having a thickness of approximately 180–350 Å. In the preferred embodiment, cell 10 should, in its normal or erased state, have a threshold voltage $V_T$ equal to approximately –1.0 to –5.0 V depending upon the particular cell and the configuration of its associated array. The particular value of $V_T$ may be altered by conventional ion implanting of dopants into channel region 12.

The operation of cell 10 is as follows. To program cell 10, approximately 8 V is applied to P+ source 14 and N– well 18 while drain 16 is held at 2V. The voltage at control gate 26 is ramped up from $V_{cc}$ to approximately 12 V. Acceptable ranges for these programming voltages are listed below in Table 1. Now referring also to FIG. 2A, positively charged holes near source 14 and channel 12 are attracted to the less positive voltage on P+ drain 16 and are accelerated through channel region 12 towards P+ drain 16, as indicated by arrow 1. These holes collide with electrons and lattice atoms in a drain depletion region 30, thereby resulting in impact ionization, as indicated by star 2. The high energy electrons generated from impact ionization, attracted by the positive voltage on control gate 26, are injected from depletion region 30 into floating gate 22, as indicated by arrow 3. The resultant negative charge on floating gate 22 depletes channel region 12 and forces cell 10 into deep depletion. In the preferred embodiment, cell 10 has, in its programmed state, a $V_T$ equal to approximately 4 V. The programming voltages mentioned above and listed in Table 1, by effecting such a low channel current PMOS hot electron injection (LCCPHEI) programming, allow cell 10 to be bit-selectable during programming.

Figure 2A:
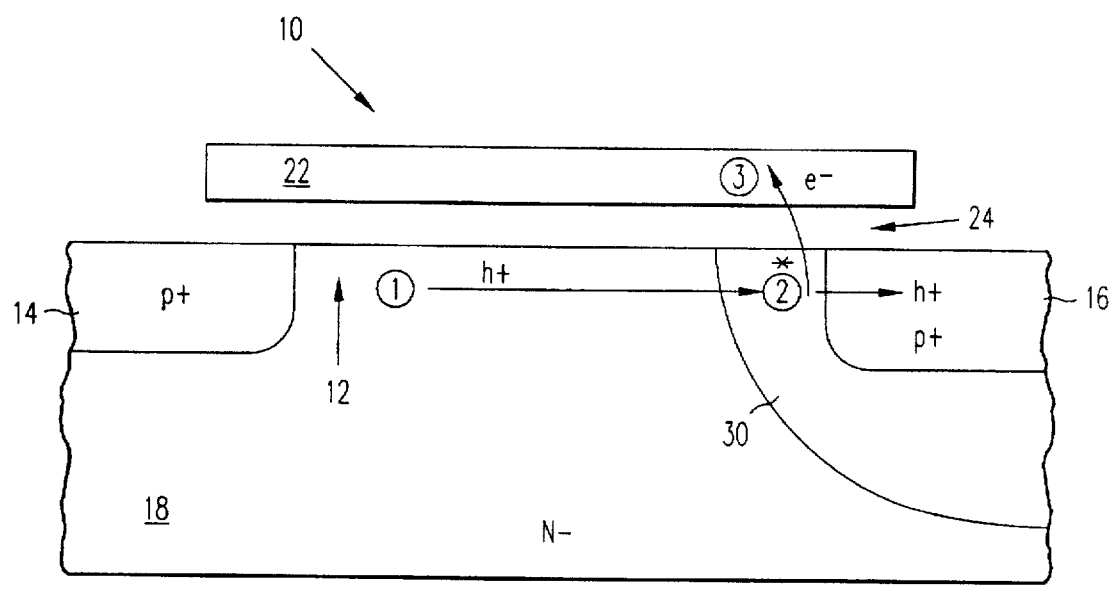
FIGS. 2A and 2B are cross-sectional views of a portion of the cell of FIG. 1 illustrating programming of the cell.
Figure 2B:
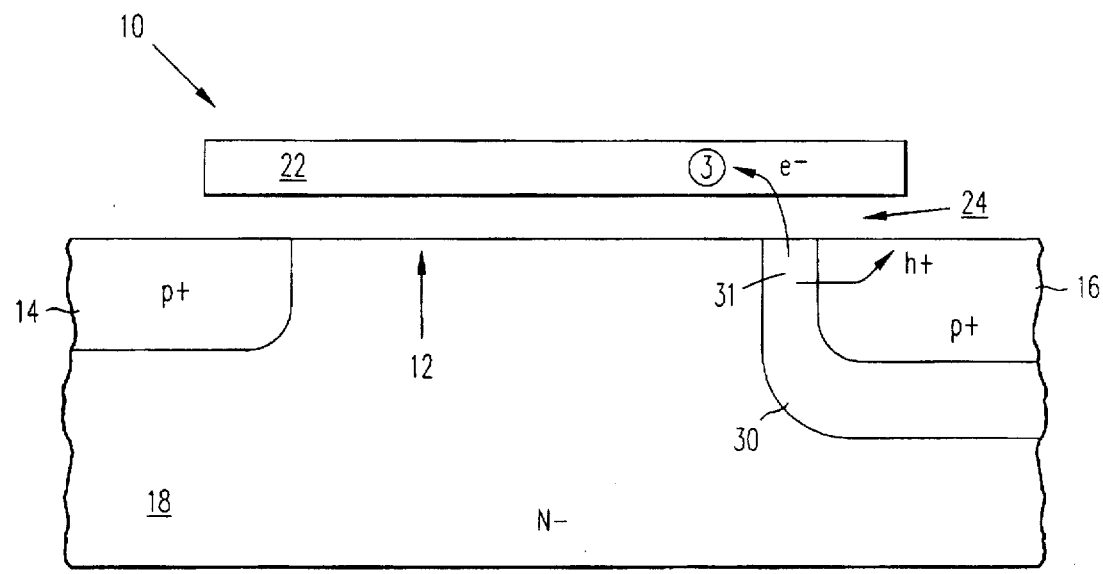

In another embodiment, cell 10 may be programmed by hot electron injection without a channel current. Referring now to FIGS. 1 and 2B, approximately 8 V is applied to N-well 18, approximately 12 V is applied to control gate 26, and approximately 2 V is applied to P+ drain 16. P+ source 14 is at a floating potential. The reverse bias across the P+ drain 16 and N-well 18 junction, combined with the positive voltage coupled to floating gate 22 via control gate 26, creates a sufficiently high electric field in a region 31 near the interface of tunnel oxide layer 24 and depletion region 30 to generate high energy electrons which are injected from region 31 into floating gate 22, as indicated by arrow 3. In this manner, hot electron injection is induced by band-to-band tunneling.

Figure 2C:
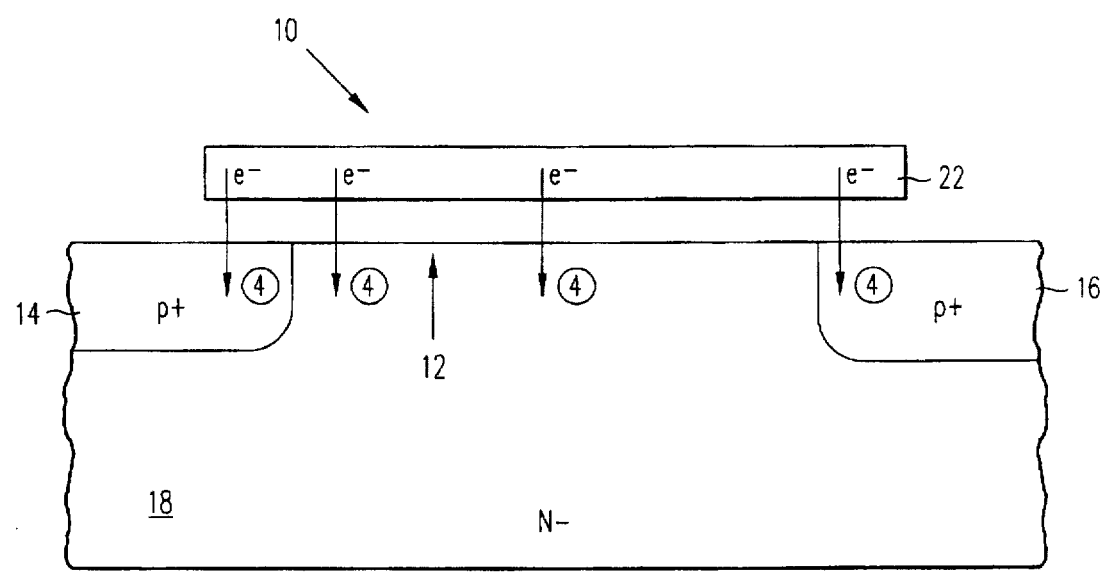
FIG. 2C is a cross-sectional view of a portion of the cell of FIG. 1 illustrating erasing of the cell.

To erase cell 10, approximately 17 volts is applied to P+ source 14, P+ drain 16, and N– well 18 while control gate 26 is grounded. Acceptable ranges for these erase voltages are listed below in Table 1 under "Erase Option 1". Referring also to FIG. 2C, the equal bias voltages applied to P+ source 14, P+ drain 16, and N– well 18 attract electrons stored in floating gate 22 (FIG. 2A). Electrons tunnel from floating gate 22 across the entire length of tunneling oxide layer 24 into channel 12, source 14, and drain 16, thereby returning the threshold voltage of cell 10 to that of its erased state. Note that electrons will tunnel from floating gate 22 and thereby erase cell 10 only if the drain 16 voltage is approximately 17 volts.

In another embodiment, cell 10 may be erased by applying approximately 8 volts to P+ source 14, P+ drain 16, and N– well 18 and applying approximately –8 volts to control gate 26. Acceptable ranges for such voltages are listed below in Table 1 as "Erase Option 2". The application of Option 2 erase voltages, which results in an erasing of cell 10 in manner identical to that described above with respect to Option 1, allows erasing voltages of only 8 volts to be used without any degradation in performance of cell 10. In this manner, cell 10 allows for High Endurance Selectable Channel (HESC) erasing.

Where it is desired to read cell 10, $V_{cc}$ is applied as a read voltage to source 14 and N– well 18. A voltage between 0 and $V_{cc}$, depending upon the associated array configuration, is applied to control gate 26. A voltage less than $V_{cc}$ is applied to P+ drain 16. Cell 10 will conduct a channel current only if cell 10 is programmed, i.e., only if charge is stored in floating gate 22. Thus, the voltage on floating gate 22 will be lower than the voltage on P+ source 14, P+ drain 16, and N-well 18. Further, when cell 10 is in an erased state, the voltage on floating gate 22 remains lower than the voltage on P+ source 14, P+ drain 16, and N-well 18. As a result, cell 10 does not suffer from read disturb problems characteristic of conventional NMOS memory devices. Note that the voltage on floating gate 22 will be lower than the voltage on P+ source 14, P+ drain 16, and N-well 18 as long as the $V_t$ of cell 10, with floating gate 22 uncharged, is less than or equal to approximately –4.5 V and the read voltages shown in Table 1 are utilized.

TABLE 1

|  | Drain | Control gate | Source | N-well |
| --- | --- | --- | --- | --- |
| programming (with channel current) | 0V to 2V | Vcc ramped up to 16V | floating | 5V to 15V |
| programming (without channel current) | 0V to 2V | 5V to 16V | 5V to 15V | 5V to 15V |
| erase (option 1) | 15V to 22V | 0V | 15V to 22V | 15V to 22V |
| erase (option 2) | 3V to 15V | (-15V) to (-3V) | 3V to 15V | 3V to 15V |
| Read | Less than VCC | 0V to Vcc | VCC | Vcc |

The above-described operation of cell 10 utilizes PMOS characteristics to achieve numerous other advantages over conventional semiconductor memory cells. The characteristic gate current for P-channel devices is approximately 100 times that of N-channel devices. Thus, unlike conventional NMOS memory cells which typically require approximately a 0.5 milli-amp programming current to charge the floating gate, cell 10 requires a programming current of only a few micro-Amps. Requiring a programming current two orders of magnitude smaller than that of conventional NMOS memory cells such as EPROMs not only allows cell 10 to reduce power consumption during programming but also allows for page writing, i.e., to simultaneously write to numerous ones of cells 10 in a row of an associated memory array (not shown).

It is known that the channel of conventional NMOS flash memory cells must be of a sufficient length to tolerate the typically high reverse bias voltage across the P-well/N+ drain junction (as well as the resultant high electric field) required during erasing via electron tunneling. As a result, it is difficult to further reduce the size of such conventional cells without incurring destructive junction stress which, in turn, may lead to reliability problems. Since, however, the operation of cell 10 neither requires nor utilizes such high junction biases during erasing (see Table 1), minimizing the channel length of cell 10 is not so limited. This feature allows cell 10 to be fabricated using technology, sub-micron technology, and in particular, technology producing feature sizes less equal to or less than 0.7 μm. Avoiding such high junction biases during erasing also advantageously results in a more durable and reliable memory cell.

Note that as the channel length of an NMOS transistor falls below approximately 0.7 μm, electron mobility saturates. In PMOS devices, however, hole mobility continues to increase as the channel length decreases below 0.7 μm and becomes comparable to that of electron mobility as the gate length is further decreased. Accordingly, minimizing the channel length of cell 10 also advantageously results in a hole mobility comparable to that of electrons, thereby increasing the speed of cell 10. Further, note that when programmed, cell 10 is in deep depletion. This allows for a higher read current and thus for faster read speeds.

Figure 3:
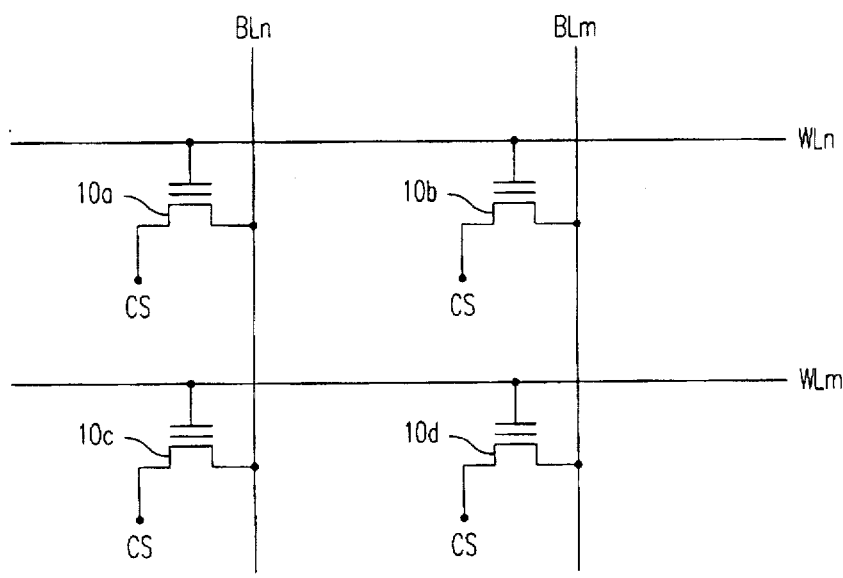
FIG. 3 is an array employing the cells of FIG. 1.

Cell 10 may be employed in an array configuration a portion of which is shown in FIG. 3. The sources 14 of cells 10a-10d are coupled to a common source node CS. The control gate 26 of cells 10 in a row are coupled to a word line for that row, and the drains 16 of cells 10 in a column are coupled to a bit line BL for that column. The bias conditions for programming and reading for instance cell 10a (and for erasing all of cells 10) are provided below in Tables 2A-2D.

TABLE 2A

| Cell 10A voltages | | | | |
| --- | --- | --- | --- | --- |
|  | Drain | Source | Control Gate | N-well |
| Program | 0 | Floating | 4-10V | 3.5-7V |
| Erase | 3-15V | 3-15V | -3 to -15V | 3-15V |
| Read | less than V$_{cc}$ | V$_{cc}$ | 0 | V$_{cc}$ |

TABLE 2B

| Cell 10B voltages | | | | |
| --- | --- | --- | --- | --- |
|  | Drain | Source | Control Gate | N-well |
| Program | Floating | Floating | 4-10V | 3.5-7V |
| Erase | 3-15V | 3-15V | -3 to -15V | 3-15V |
| Read | Floating | V$_{cc}$ | 0 | V$_{cc}$ |

TABLE 2C

| Cell 10C voltages | | | | |
| --- | --- | --- | --- | --- |
|  | Drain | Source | Control Gate | N-well |
| Program | Floating | Floating | 0 | 3.5-7V |
| Erase | 3-15V | 3-15V | -3 to -15V | 3-15V |
| Read | less than V$_{cc}$ | V$_{cc}$ | V$_{cc}$ | V$_{cc}$ |

TABLE 2D

| Cell 10D voltages | | | | |
| --- | --- | --- | --- | --- |
|  | Drain | Source | Control Gate | N-well |
| Program | 0 | Floating | 0 | 3.5-7V |
| Erase | 3-15V | 3-15V | -3 to -15V | 3-15V |
| Read | Floating | V$_{cc}$ | V$_{cc}$ | V$_{cc}$ |

Figure 4:
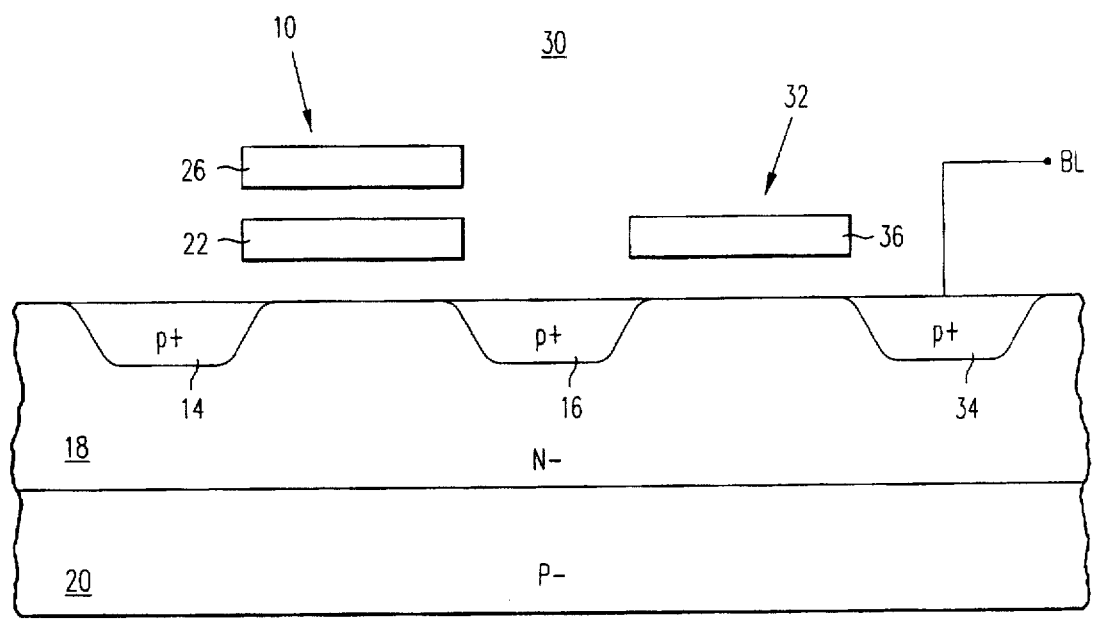
FIG. 4 is a cross-sectional view of the cell of FIG. 1 implemented as part of a NOR cell.

The above described cell 10 may be employed as part of a larger NOR memory array. FIG. 4 shows a 2-transistor memory cell 30 including a P-channel MOS transistor 32 as the bit line select transistor 32 and cell 10 as the storage transistor. Select transistor 32 includes a P+ source 16 (note that P+ region 16 also serves as drain 16 for cell 10) and a P+ drain 34 formed in N-well 18. Current flow through select transistor 32 is controlled by a gate 36. A bit line BL is coupled to drain 34 of select transistor 32.

The electric bias conditions for programming, erasing, and reading cell 30 are summarized below in Table 3. Since cell 30 includes P-channel cell 10 and P-channel select transistor 32, cell 30 realizes all the advantages discussed above with respect to cell 10. When provided as part of a NOR memory array, cell 10, when programmed, operates as a depletion device.

TABLE 3

|  | Bit line | select gate | control gate | Source | N-well |
|---|---|---|---|---|---|
| programming (with channel-current) | 0V | 0V | vcc ramp up to 16V | 5V to 15V range | 5V to 15V range |
| programming (without channel current) | 0V | 0V | 5V to 16V | 5V to 15V | 5V to 15V |
| erase (option 1) | 15V to 22V range | 0V | 0V | 15V to 22V range | 15v to 22V range |
| erase (option 2) | 3V to 15V range | 0V | (−15V) to (−3V) range | 3V to 15V range | 3V to 15V range |
| Read | Less than Vcc | 0V | 0 to Vcc | Vcc | Vcc |

Figure 5:
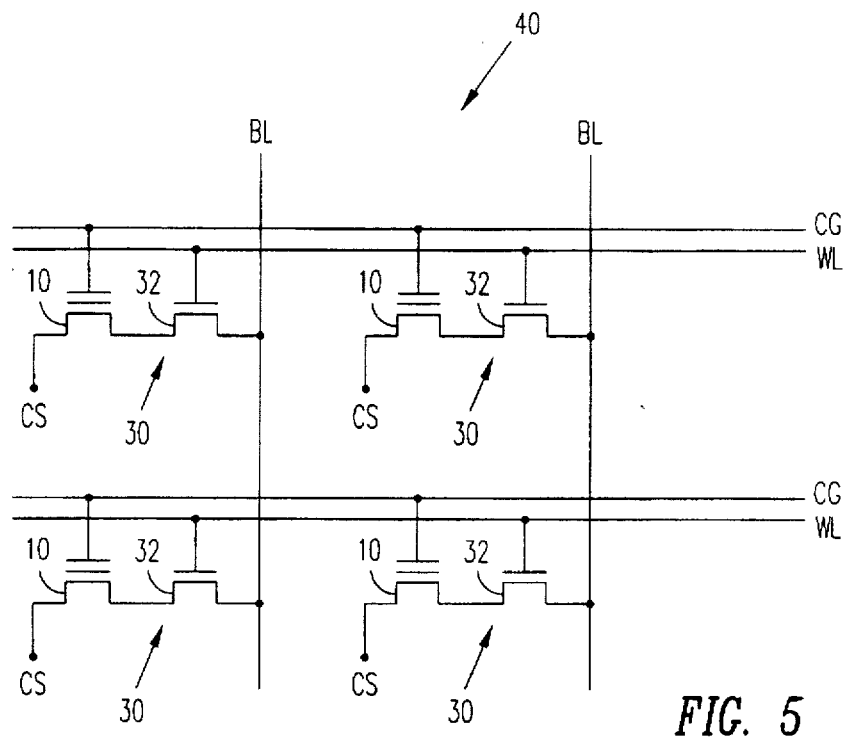
FIG. 5 is an array employing cells of FIG. 4.

FIG. 5 shows a portion of a NOR array 40 employing as memory elements cell 30. The sources 14 of each of cells 10 in array 40 are coupled to a common source node CS. In one embodiment P+ sources 14 of cells 10 may be shorted to N-well 18 by N+ pick-up implants (not shown). The drain 34 of each bit line select transistor 32 in a column are coupled to a bit line BL for that column. The control gates 26 of cells 10 in a are coupled to a control line CG for that row, while the gates of bit line select transistors 32 in a row are coupled to a word line WL for that row.

Array 40 is bit programmable using low voltages and low current, and may be erased in bulk using low voltages and low current. Note that the control gates 26 of cells 10 may be held at the same potential and thus do not need to be decoded, i.e., the selected and unselected control gates may be held at the same potential. This allows for a simpler design. The preferred bias conditions and acceptable ranges for bias conditions operating NOR array 40 employing cells 30 in accordance with the present invention are listed below in Tables 4A and 4B, respectively, where NOR array 40 is operating on a supply voltage (not shown) $V_{cc}$.

transistor 52 as the source select transistor and cell 10 as the storage transistor. Select transistor 52 includes a P+ source 54 formed in N-well 18 and a gate 56. Source 14 of cell 10 serves as a drain for select transistor 52. A bit line BL is coupled to drain 16 of storage cell 10. Since cell 50 includes P-channel cell 10 and P-channel source select transistor 52, cell 50 realizes all the advantages discussed above with respect to cell 10.

Figure 7:
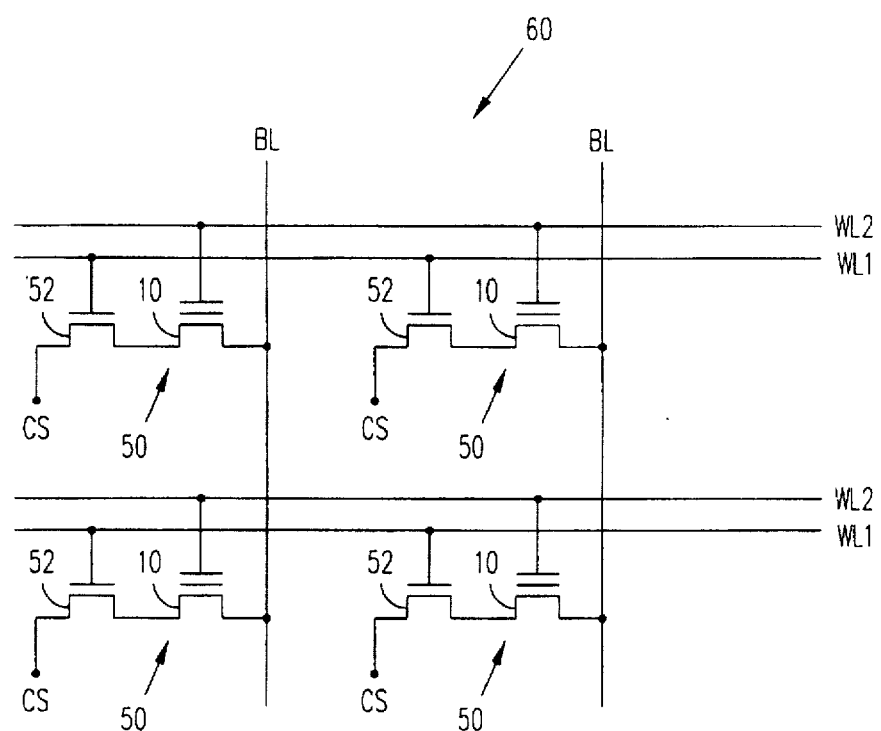
FIG. 7 is an array employing the cells of FIG. 6.

FIG. 7 shows a portion of a Flash array 60 employing as memory elements cell 50. The source 54 of each of source select transistor 52 of cells 10 in array 60 is coupled to a common source node CS. In one embodiment P+ sources 14 of cells 10 may be shorted to N-well 18 by N+ pick-up implants (not shown). The drain 16 of each of cells 10 in a column is coupled to a bit line BL for that column. The gates 56 of source select transistors 52 in a row are coupled to a first word line WL1 for that row. The control gates 26 of cells 10 in a row are coupled to a second word line WL2.

Array 60 is bit programmable and may be erased in either bulk or sector modes. In the operation of array 60, both the first word line WL1 and the second word line WL2 voltages

TABLE 4A

|  | Bit Line | | Word Line | | Cell Gate | C'mon | |
|---|---|---|---|---|---|---|---|
|  | selected | unselected | selected | unselected | CG | Source | N-well |
| read | $V_{cc}$−2V | Floating | 0 | $V_{cc}$ | $V_{cc}$−2V | $V_{cc}$ | $V_{cc}$ |
| erase | 8V | n/a | 0 | n/a | −8V | 8V | 8V |
| program | 0 | 8V or floating | 0 | 8V | 0V ramped to 12V | 8V | 8V |

TABLE 4B

|  | Bit Line | | Word Line | | Cell Gate | C'mon | |
|---|---|---|---|---|---|---|---|
|  | selected | unselected | selected | unselected | CG | Source | N-well |
| read | less than $V_{cc}$ | Floating | 0–2V | $V_{cc}$ | less than $V_{cc}$ | $V_{cc}$ | $V_{cc}$ |
| erase | 3–15V | n/a | 0 | n/a | −3 to −15V | 3–15V | 3–15V |
| program | 0 | 5–15V | 0 | 5–15V | 0V ramped to 12V | 5–15V | 5–15V |

Figure 6:
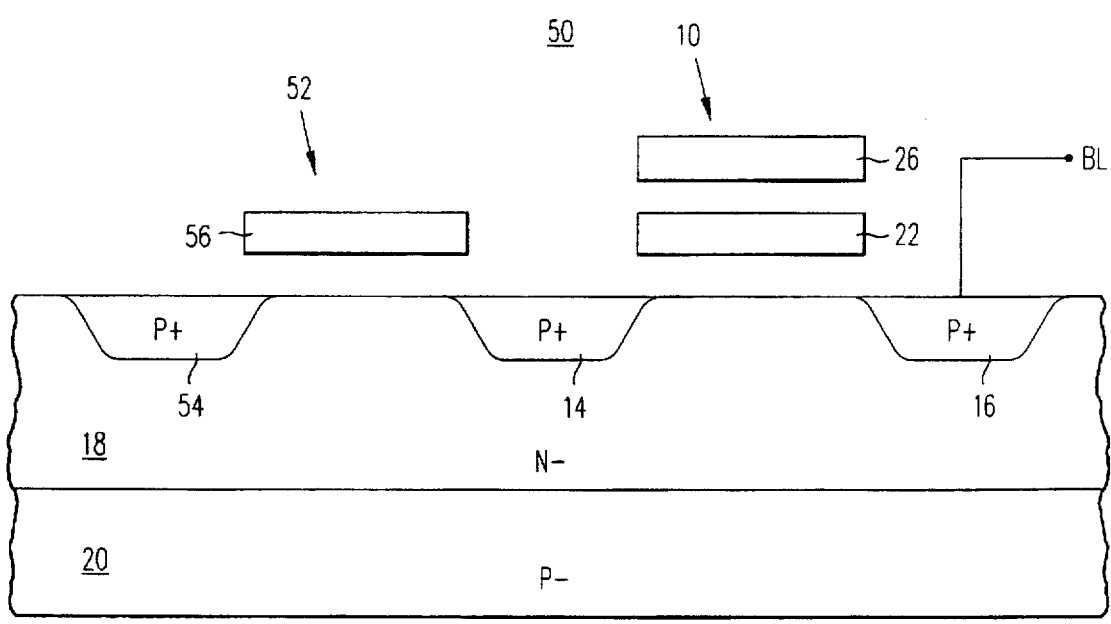
FIG. 6 is a cross-sectional view of the cell of FIG. 1 implemented as part of a Flash cell.

The above described embodiments may also be employed as part of a larger flash memory array. FIG. 6 shows a 2-transistor memory cell 50 including a P-channel MOS need to be decoded. Note that provided as part of a flash memory array, cell 10, when programmed, operates as a depletion device.

The preferred bias conditions and acceptable ranges for bias conditions for operating array 60 employing cells 50 in accordance with the present invention are listed below in Tables 5A and 5B, respectively, where array 60 is operating on a supply voltage (not shown) $V_{cc}$.

coupled to a control gate line CG. The gates 56 of each of source select transistors 52 in a row are coupled to a second word line WL2 for that row.

Array 80 is bit programmable and erasable in either bulk, sector, or bit modes and may be operated using low pro-

TABLE 5A

| | Bit Line | | Word line 1 | | Word Line 2 | | | |
|---|---|---|---|---|---|---|---|---|
| | select | un-select | select | un-select | select | un-select | CS | N-well |
| read | $V_{cc}$-1.5V | Float | $V_{cc}$-2V | $V_{cc}$-2V | 0 | $V_{cc}$ | $V_{cc}$ | $V_{cc}$ |
| sector erase | 8V | 0 | 8V | 8V | -8V | -8V | 8V | 8V |
| bulk erase | 8V | 0 | 0 | 0 | -8V | -8V | 8V | 8V |
| p'gram | 0 | 6V | 0 | 6V | ramp from 0 to 10V | 0 | 6V | 6V |

TABLE 5B

| | Bit Line | | Word Line 1 | | Word Line 2 | | | |
|---|---|---|---|---|---|---|---|---|
| | select | un-select | select | un-select | select | un-select | CS | N-well |
| read | less than $V_{cc}$ | Float | less than $V_{cc}$ | less than $V_{cc}$ | 0 | $V_{cc}$ | $V_{cc}$ | $V_{cc}$ |
| sector erase | 3–15V | 0 | 3–15V | 3–15V | -3 to -15V | -3 to -15V | 3–15V | 3–15V |
| bulk erase | 3–15V | 0 | 0 | 0 | -3 to -15V | -3 to -15V | 3–15V | 3–15V |
| p'gram | 0 | 4–12V | 0 | 4–12V | ramp from 0 to 10V | 0 | 4–12V | 4–12V |

Figure 8:
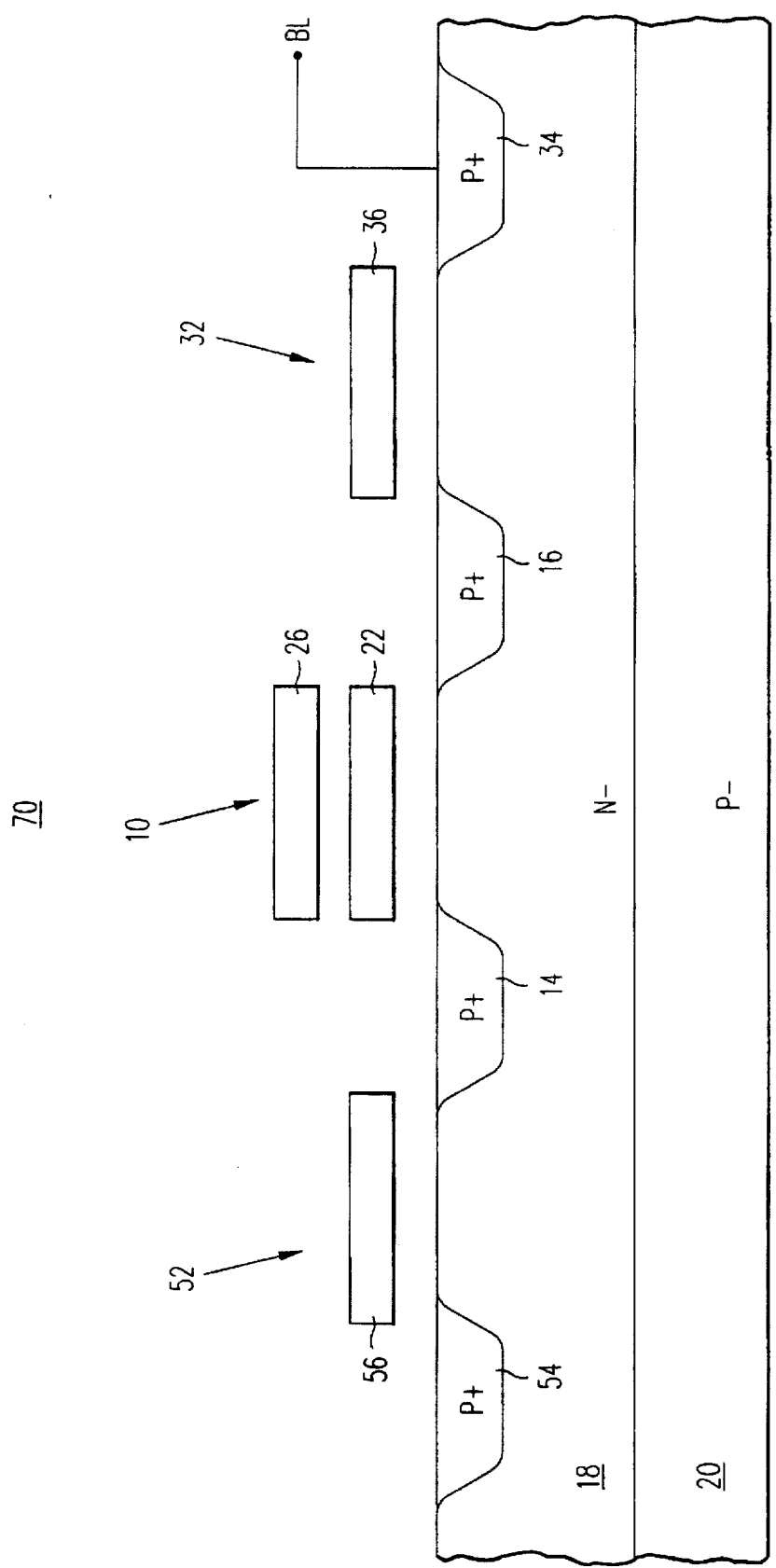
FIG. 8 is a cross-sectional view of the cell of FIG. 1 implemented as part of an EEPROM cell.

The above described embodiments may also be employed as part of a larger flash EEPROM memory array. Referring now to FIG. 8, a 3-transistor memory cell 70 including storage cell 10 and both P-channel bit line select transistor 32 and P-channel source select transistor 52 which, as discussed earlier are connected to the drain and source, respectively, of cell 10. The drain 34 of bit line select transistor 52 is connected to bit line BL. Cell 70 realizes all the advantages discussed above with respect to cell 10.

Figure 9:
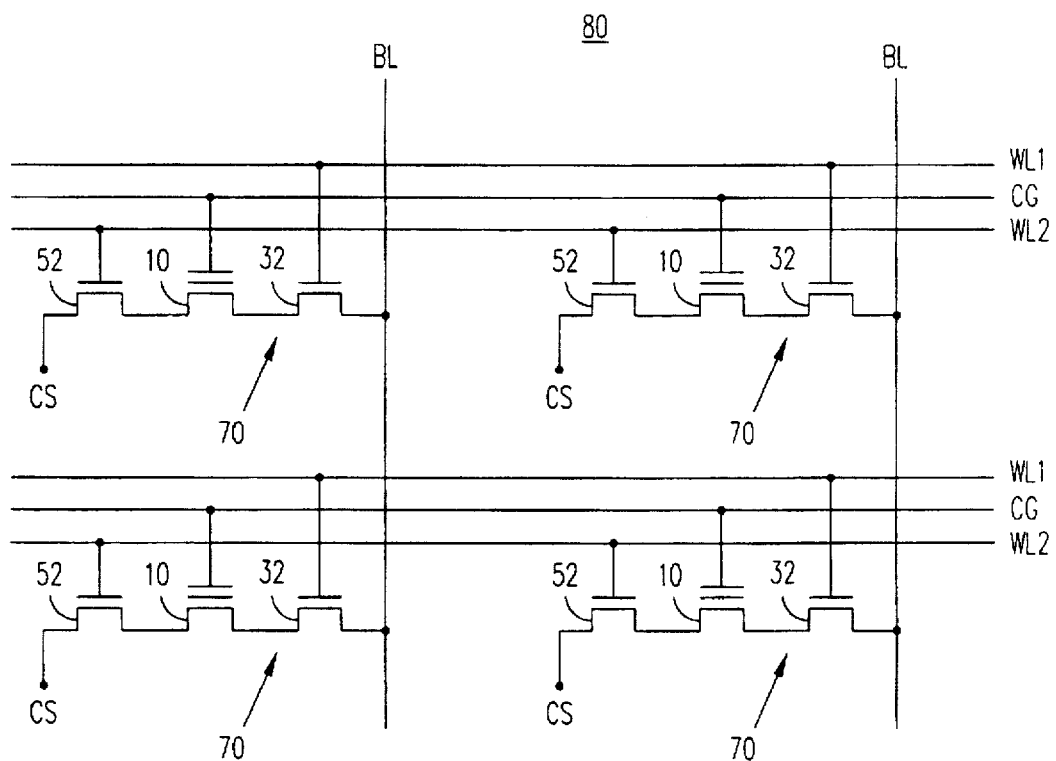
FIG. 9 is an array employing the cells of FIG. 8.

FIG. 9 shows a portion of an array 80 employing as memory elements EEPROM cells 70. The source 54 of each of source select transistor 52 of cells 10 in array 80 is coupled to a common source node CS. The drain of each of bit line select transistors 32 in a column is coupled to a bit line BL for that column. The gates 36 of bit line select transistors 32 in a row are coupled to a first word line WL1 for that row. The control gates 26 of cells 10 in a row are gramming voltages and currents. Each of word lines WL1 and WL2 and control gate line CG may be advantageously held at the same potential and thus do not need to be decorded. Note that cell 10, when programmed, operates as a depletion device.

The preferred and acceptable ranges for bias conditions for operating array 80 employing cells 70 in accordance with the present invention are listed below in Tables 6A and 6B, where array 80 is operating on a supply voltage (not shown) $V_{cc}$.

TABLE 6A

| | Bit Line | | Word Line 1 | | Word Line 2 | | | | |
|---|---|---|---|---|---|---|---|---|---|
| | select | un-select | select | un-select | select | un-select | CG | CS | N-well |
| read | $V_{cc}$-2V | Float | 0 | $V_{cc}$ | 0 | 0 to $V_{cc}$ | $V_{cc}$—2V | $V_{cc}$ | $V_{cc}$ |
| erase | 8V | 0 | 0 | 8V | 8V | 0 | -8V | 0 | 8V |
| p'gram | 0 | 8V | 0 | 8V | 0 | 0 or 8V | ramp 0 to 12V | 8V | 8V |

TABLE 6B

| | Bit Line | | Word Line 1 | | Word Line 2 | | | | |
|---|---|---|---|---|---|---|---|---|---|
| | select | un-select | select | un-select | select | un-select | CG | CS | N-well |
| read | less than $V_{cc}$ | Float | 0 | $V_{cc}$ | 0 | less than $V_{cc}$ | less than $V_{cc}$ | $V_{cc}$ | $V_{cc}$ |
| erase | 3–15V | 0 | 0 | 3–15V | 3–15V | 0 | –3 to –15V ramp | 0 | 3–15V |
| p'gram | 0 | 5–15V | 0 | 5–15V | 0 | 0 or 5–15V | 0V to 12V | 5–15V | 5–15V |

The fabrication of a cell 10 in accordance with the present invention will be discussed below in the context of a larger memory structure 100 which includes, in addition to a plurality of cells 10, a peripheral circuit having NMOS and PMOS transistors. Although the fabrication of cell 10 is described below as a twin-well process, cell 10 may also be fabricated according to an N-well process without departing from the scope of the present invention.

Figure 10:
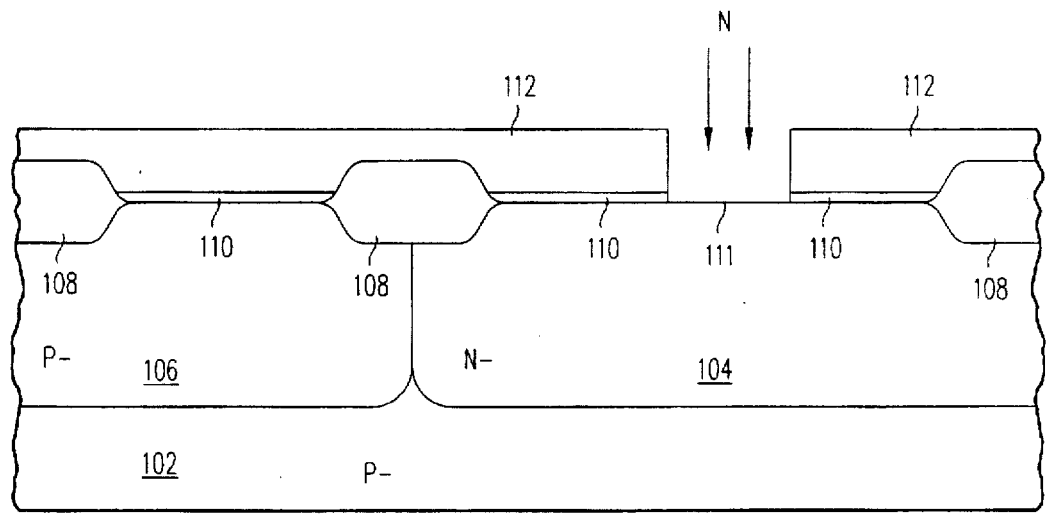
FIGS. 10–13 illustrate the fabrication of a P-channel memory cell in accordance with the present invention.

Referring now to FIG. 10, structure 100 includes a P-type substrate 102 having formed by conventional means therein an N– well 104 and a P– well 106. The resistivity and thickness of N– well 104 and P– well 106 will depend upon the desired characteristics of the devices to be formed therein. Field oxide regions 108 approximately 7500 Å thick and a layer of pad oxide 110 approximately 240 Å thick are formed on a top surface of substrate 102 by any suitable means. A masking layer 112, which may be photo-resist or any other suitable masking material, is formed and then selectively etched using conventional methods to form the pattern shown in FIG. 10.

Figure 11:
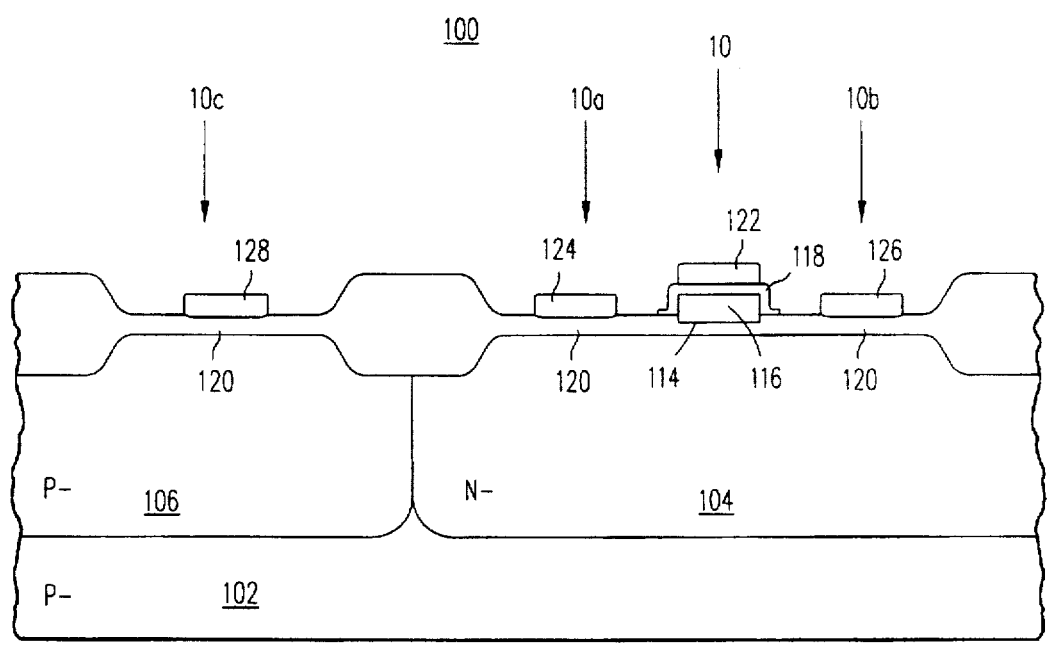

N-type dopants such as Arsenic is implanted at an energy of approximately 100 keV (or Phosphorus at 50 keV) and a dosage of approximately 2E13 ions/cm² into a portion 111 of N-well 104 which will become in later steps channel 111 of cell 10. Making layer 112 is then removed by a suitable etchant. After forming a tunnel oxide layer 114 approximately 80–130 Å thick, a poly-silicon layer is deposited over structure 100 andselectively etched to form floating gate 116. An ONO insulating layer 118 is formed and then selectively etched, as indicated in FIG. 11, so as to completely overlie floating gate 116.

Portions of pad oxide 110 are removed using suitable etching techniques and a double layer of gate oxide 120 approximately having thicknesses of 120 Å and 250 Å, respectively, grown therein. A second polysilicon layer is deposited and selectively etched to form control gate 122 of cell 10, gates 124 and 126 of PMOS peripheral transistors 10a and 10b, respectively, and gate 128 of NMOS peripheral circuit 10c. Note that PMOS peripheral transistors 10a and 10b and NMOS peripheral transistor 10c are representative of PMOS and NMOS peripheral circuitry, respectively, of cell 10's associated memory array (not shown).

Figure 12:
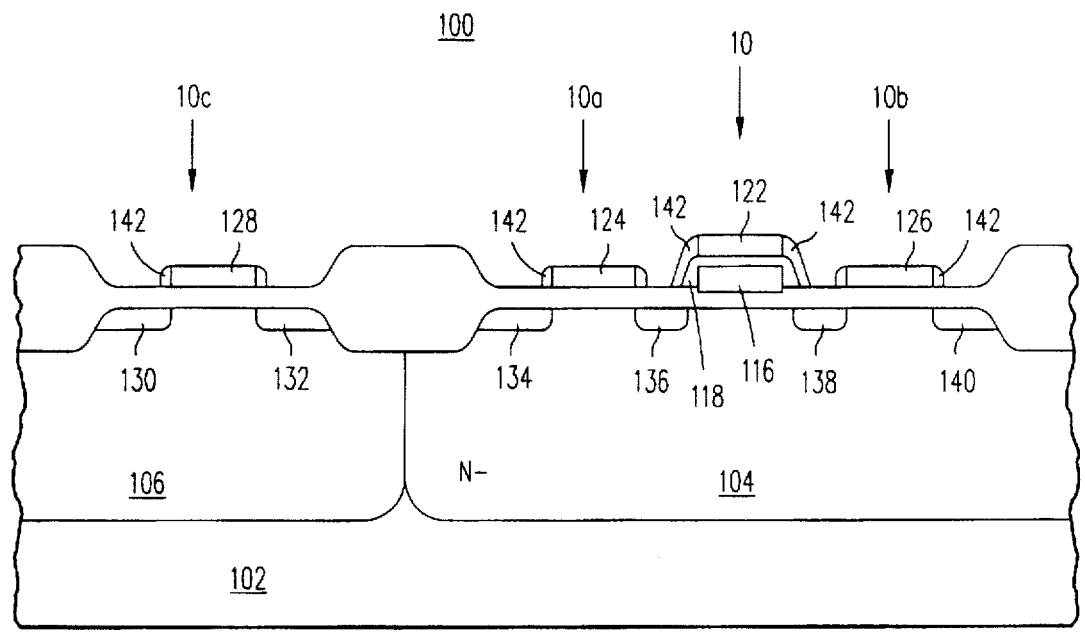

Referring now to FIG. 12, PMOS cell 10 and PMOS transistors 10a and 10b are masked. N-type dopants such as Phosphorus is implanted at an energy of approximately 40 keV and a dosage of approximately 3E13 ions/cm² into P-well 106 to form N– regions 130 and 132 which will serve as source and drain regions, respectively, of NMOS peripheral transistor 10c. This mask is removed. NMOS transistor 10c is then masked and P-type dopants such as $BF_2$ are implanted at an energy of approximately 60 keV and a dosage of approximately 7E12 ions/cm² into N-well 104 to form P– regions 134, 136, 138, and 140. Sidewall oxide spacers 142 are then formed by conventional means on the sides of control gate 122 and gates 124, 126, and 128.

Figure 13:
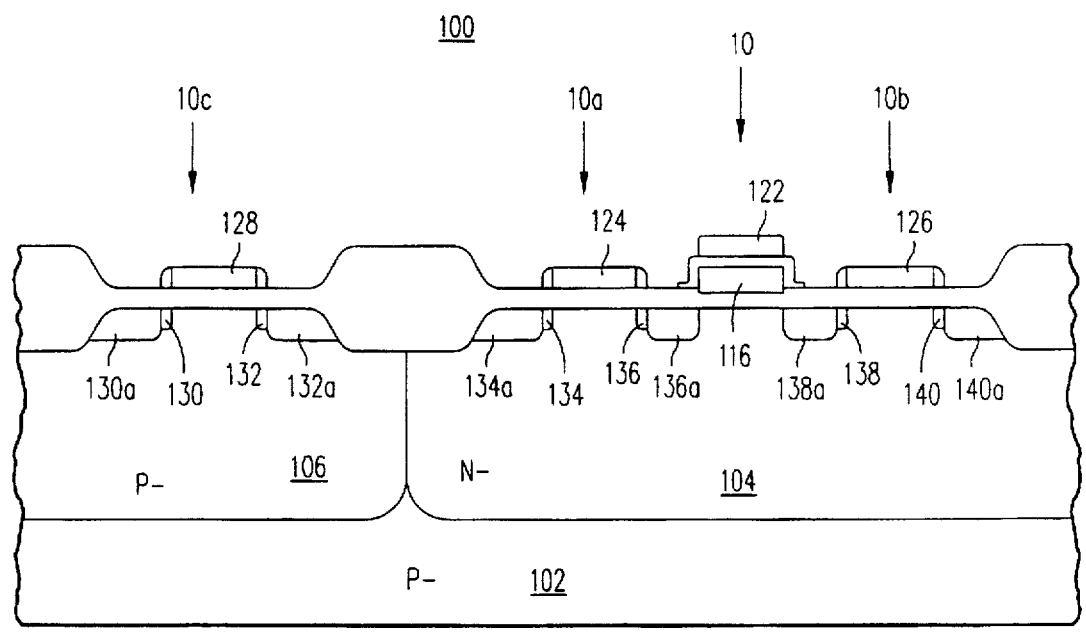

PMOS cell 10 and PMOS transistors 10a and 10b are again masked and N-type dopants, which are preferably Arsenic, are implanted at an energy of 80 keV and a dosage of 5E15 ions/cm² into P-well 106 to form N+ diffusion regions 130a and 132a, as shown in FIG. 13. The PMOS mask is then removed. Structure 100 is again masked and the sidewall spacers 142 on either side of control gate 122 are dipped. This ensures that in a subsequent doping step the source and drain regions of cell 10 will be of a P+ diffusion structure, as opposed to the lightly doped drain (LDD) structure of P–/P+ diffusion region 134/134a. After this mask is removed, NMOS transistor 10c is masked and P-type implants, preferably $BF_2$, are implanted at an energy of 50 keV and a dosage of 2E15 ions/cm² into N-well 104 to form P+ regions 134a, 136a, 138a, and 140a. Thus, P+ diffusion regions 136a and 138a serves as the source and drain regions, respectively, of cell 10. The N–/N+ diffusion regions 130/130a and 132/132a will serve as the source and drain regions, respectively, of NMOS transistor 10c, P–/P+ diffusion regions 134/134a and 136/136a will serve as the source and drain regions, respectively, of PMOS peripheral transistor 10a, and P–/P+ diffusion regions 138/138a and 140/140a will serve as the source and drain regions, respectively, of PMOS peripheral transistor 10b. The remaining portions of structure 100 may be completed according to well known fabrication techniques.

The process described above with respect to FIGS. 10–13 requires fewer masking steps than do conventional processes used in the fabrication of N-channel memory cells. The source and drain regions of cell 10 may be of the same dopant concentration and depth as the source and drain regions of PMOS peripheral transistors 10a and 10b. Accordingly, a single masking-etching-doping sequence may be used to form the P+ source and P+ drain regions of cell 10 and the P+ source and P+ drain regions of PMOS peripheral transistors 10a and 10b, as described above. The fabrication of an N-channel memory cell, on the other hand, requires an additional masking step since the source and drain regions of a conventional N-channel flash cell must be of a different dopant concentration than the source and drain regions of the NMOS peripheral transistors associated therewith. Note that the above-described process may also be used to form cell 10 and associated peripheral transistors 10a–10c in an N-well structure.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A semiconductor memory cell comprising:

an N-type well region having formed therein a P+ source, a P+ drain, and a channel region extending between said P+ source and said P+ drain;

a first insulating layer overlying said N-type well region;

a floating gate overlying said first insulating layer;

a second insulating layer overlying said floating gate; and a control gate overlying said second insulating layer, wherein said cell is programmed by applying between approximately 5–15 volts to said P+ source and to said N-type well region, grounding said P+ drain, and applying a voltage which ramps from a supply voltage to as high as approximately 16 volts to said control gate.

2. The structure of claim 1, wherein said cell is programmed by applying between approximately 5–15 volts to said P+ source and to said N-type well region, grounding said P+ drain, and applying between approximately 5–16 volts to said control gate.

3. The structure of claim 1, wherein said cell is erased by applying between approximately 15–22 volts to said P+ source, to said N-type well region, and to said P+ drain, and grounding said said control gate.

4. The structure of claim 1, wherein said cell is erased by applying between approximately 3–15 volts to said P+ source, to said N-type well region, and to said P+ drain, and applying between approximately −3 and −15 volts to said control gate.

5. The structure of claim 1, wherein said cell is read by applying said supply voltage to said P+ source and to said N-type well region, applying a voltage between approximately 0 volts and said supply voltage to said control gate, and applying a read voltage less than a supply voltage to said P+ drain.

6. A semiconductor memory cell comprising:

an N-type well region having formed therein a P+ source, a P+ drain, and a channel region extending between said P+ source and said P+ drain;

a first insulating layer overlying said N-type well region;

a floating gate overlying said first insulating layer;

a second insulating layer overlying said floating gate;

a control gate overlying said second insulating layer, and a select transistor formed in said N-type well region said select transistor comprising a select gate coupled to a word line, a P+ source coupled to a bit line, a P+ drain coupled to said P+ source of said cell, and a channel region extending between said P+ source and drain of said select transistor, wherein said cell is programmed by applying between approximately 4–13 volts to said P+ sources and to said N-type well region, grounding said word line and said bit line, and applying a voltage which ramps from 0 to approximately 10 volts to said control gate, said cell operating from a supply voltage.

7. The structure of claim 6, wherein said cell is erased by applying between approximately 3–13 volts to said P+ sources, to said N-type well region, and to said bit line, grounding said word line, and applying between approximately −3 and −15 volts to said control gate.

8. The structure of claim 6, wherein said cell is read by applying a supply voltage to said P+ sources and to said N-type well region, grounding said control gate, and applying a voltage approximately 2 volts less than said supply voltage to said word line and to said bit line.

9. A semiconductor memory cell comprising:

an N-type well region having formed therein a P+ source, a P+ drain, and a channel region extending between said P+ source and said P+ drain;

a first insulating layer overlying said N-type well region;

a floating gate overlying said first insulating layer;

a second insulating layer overlying said floating gate; and a control gate overlying said second insulating layer, a bit line select transistor having a P+ source coupled to said P+ drain of said cell, a P+ drain coupled to a bit line, and a select gate coupled to a first word line; and a source select transistor having a P+ source, a P+ drain coupled to said P+ source of said cell, and a gate coupled to a second word line, wherein said structure operates on a supply voltage.

10. The structure of claim 9, wherein said cell is programmed by applying between approximately 5 and 15 volts to said P+ sources and to said N-type well region, grounding said first and second word lines and said bit line, and applying a voltage which ramps from 0 to as high as approximately 16 volts to said control gate.

11. The structure of claim 9, wherein said cell is erased by applying between approximately 3–15 volts to said N-type well region, to said second word line, and to said bit line, grounding said first word line and said P+ sources, and applying between approximately −3 and −15 volts to said control gate.

12. The structure of claim 9, wherein said cell is read by applying said supply voltage to said P+ sources and to said N-type well region, grounding said first and second word lines, and applying a voltage between approximately 0 volts and said supply voltage to said control gate and to said bit line.

13. A method of programming a floating gate P-channel memory cell having a P+ source and a P+ drain formed in an N-type well region, said method comprising the steps of:

applying a first bias voltage to said P+ source and to said N-type well region of said cell;

applying a second bias voltage to said P+ drain;

applying a third bias voltage to a control gate of said cell to cause the acceleration of holes across a channel region extending between said P+ source and said P+ drain, said holes colliding with electrons in a depletion region of said P+ drain to result in the generation of hot electrons via impact ionization, said hot electrons being injected into said floating gate, thereby negatively charging said floating gate, wherein said first bias voltage is between approximately 5 and 15 volts, said second bias voltage is between approximately 0 and 2 volts, and said third bias voltage is between approximately 5 and 16 volts.

14. A method of programming a floating gate P-channel memory cell having a P+ source and a P+ drain formed in an N-type well region, said method comprising the steps of:

applying a first bias voltage to said P+ source and to said N-type well region of said cell;

applying a second bias voltage to said P+ drain;

applying a third bias voltage to a control gate of said cell to cause the acceleration of holes across a channel region extending between said source and said drain, said holes colliding with electrons in a depletion region of said drain to result in the generation of hot electrons via impact ionization, said hot electrons being injected into said floating gate, thereby negatively charging said floating gate, wherein said first bias voltage is between approximately 5 and 15 volts, said second bias voltage is between approximately 0 and 2 volts, and said third bias is a ramped voltage increasing from approximately 0 volts to as high as approximately 16 volts.

15. A method of programming a floating gate P-channel memory cell having a P+ source and a P+ drain formed in an N-type well, said method comprising the steps of:

applying between approximately 5–15 volts to said N-type well;

coupling said source to a floating potential;

grounding said drain; and applying between approximately 5–15 volts to to a control gate of said cell to cause the injection of hot electrons from said N-type well into said floating gate, thereby charging said floating gate.

16. A method of erasing a floating gate P-channel memory cell having a P+ source and a P+ drain formed in an N-type well, said method comprising the steps of:

applying a first bias voltage to a source and said well of said cell;

applying a second bias voltage to said drain;

applying a third bias voltage to a control gate of said cell to cause the tunneling of electrons from said floating gate to said N-type well, to said P+ source, and to said P+ drain of said cell, thereby discharging said floating gate.

17. The method of claim 16 wherein said first bias voltage is between approximately 15 and 22 volts, said second bias voltage is between approximately 15 and 22 volts, and said third bias is approximately 0 volts.

18. The method of claim 16 wherein said first bias voltage is between approximately 3 and 15 volts, said second bias voltage is between approximately 3 and 15 volts, and said third bias is between approximately −3 and −15 volts.

* * * * *